(12) United States Patent
Guo et al.

(10) Patent No.: US 9,847,716 B2
(45) Date of Patent: Dec. 19, 2017

(54) APPARATUSES AND METHODS FOR MIXED CHARGE PUMPS WITH VOLTAGE REGULATOR CIRCUITS

(71) Applicant: Micron Technology, Inc., Boise, ID (US)

(72) Inventors: Xiaojiang Guo, San Jose, CA (US); Qiang Tang, Cupertino, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/640,959

(22) Filed: Jul. 3, 2017

(65) Prior Publication Data
US 2017/0317585 A1 Nov. 2, 2017

Related U.S. Application Data

(62) Division of application No. 15/144,682, filed on May 2, 2016, now Pat. No. 9,722,489.

(51) Int. Cl.
*G11C 5/14* (2006.01)
*H02M 3/07* (2006.01)
*G11C 11/4074* (2006.01)

(52) U.S. Cl.
CPC .............. *H02M 3/07* (2013.01); *G11C 5/145* (2013.01); *G11C 5/147* (2013.01); *G11C 11/4074* (2013.01)

(58) Field of Classification Search
CPC ...... G11C 5/147; G11C 5/145; G11C 11/4074
USPC ............................. 365/189.09, 156; 331/177
See application file for complete search history.

(56) References Cited

U.S. PATENT DOCUMENTS

2008/0232174 A1* 9/2008 Cornwell ............... G11C 16/30
365/189.09

OTHER PUBLICATIONS

U.S. Appl. No. 15/144,682, entitled "Apparatuses and Methods for Mixed Charge Pumps With Voltage Regulator Circuits", filed May 2, 2016.

* cited by examiner

*Primary Examiner* — Jason Lappas
(74) *Attorney, Agent, or Firm* — Dorsey & Whitney LLP

(57) ABSTRACT

Apparatuses and methods for mixed charge pumps with voltage regulator circuits is disclosed. An example apparatus comprises a first charge pump circuit configured to provide a first output, a second charge pump circuit configured to provide a second output, a plurality of coupling circuits configured to voltage couple and current couple the first output and the second output to a common node to provide a regulated voltage, and a feedback circuit configured to regulate the first output and the second output based on the regulated voltage.

14 Claims, 4 Drawing Sheets

APPARATUSES AND METHODS FOR MIXED CHARGE PUMPS WITH VOLTAGE REGULATOR CIRCUITS

CROSS-REFERENCE TO RELATED APPLICATION

This application is a divisional of U.S. patent application Ser. No. 15/144,682, filed May 2, 2016, issued as U.S. Pat. No. 9,722,489 on Aug. 1, 2017. This application and patent are incorporated by reference herein in their entirety and for all purposes.

BACKGROUND

Many traditional charge pumps include several parallel arrays that are connected together, forming a single charge pump circuit. Traditional charge pump regulation schemes employ a single charge pump circuit to charge multiple capacitive loads. Where the capacitive loads have different target voltages, the charge pump must be regulated at the highest target voltage. The output voltage of the charge pump circuit is then reduced and coupled to lower target voltages of other capacitive loads. Accordingly, a single charge pump must expend significant power to charge up to the higher target voltage, only to have the output coupled back down to a lower target voltage.

DETAILED DESCRIPTION

Certain details are set forth below to provide a sufficient understanding of embodiments of the invention. However, it will be clear to one skilled in the art that embodiments of the invention may be practiced without these particular details. Moreover, the particular embodiments of the present invention described herein are provided by way of example and should not be used to limit the scope of the invention to these particular embodiments. In other instances, well-known circuits, control signals, timing protocols, and software operations have not been shown in detail in order to avoid unnecessarily obscuring the invention.

Many traditional charge pump circuits provide charge to multiple capacitive loads to differing target voltages and regulate the charge pump at the highest required voltage. The target voltages may be high as a result of capacitive loading on wordlines in, for example, 3D NAND architecture, which is has particularly high capacitive loading requirements. Embodiments of the present invention recognize that regulating the charge pump outputs at the highest voltage has a negative effect on power efficiency and the rise time of charging the loads. Various embodiments disclosed herein use a mixed charge pump scheme (e.g., a charge pump including multiple charge pumps) to provide charge to the different capacitive loads. The outputs of the charge pumps may be voltage coupled and current coupled to provide a regulated voltage and regulated based on a reference voltage. Generally, two signals are voltage coupled when they are closely related in terms of their voltage difference. Similarly, two signals are current coupled when they have a close relationship in terms of the current magnitude that they carry.

Figure 1:
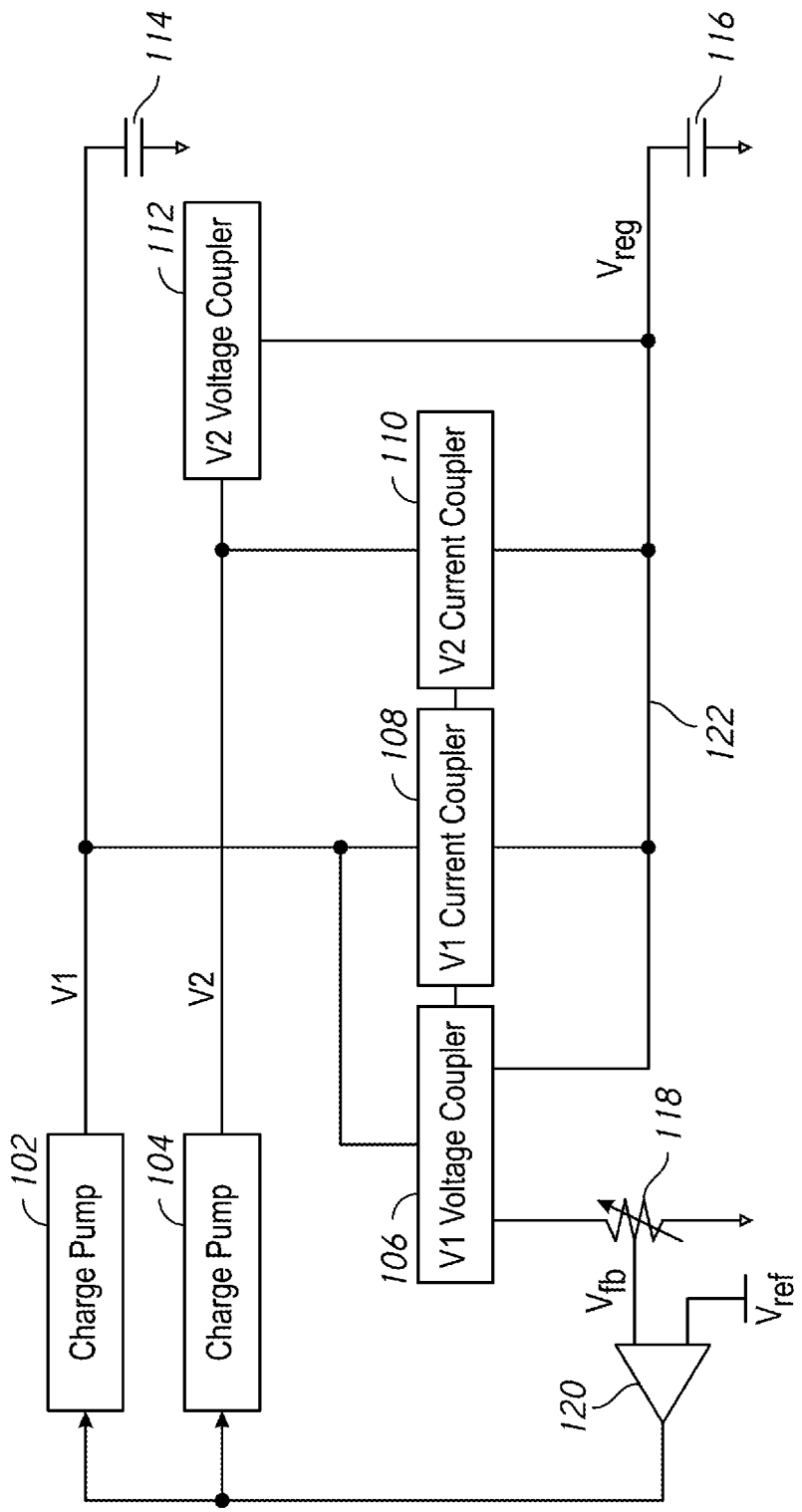
FIG. 1 is a block diagram of a mixed charge pump with a voltage regulator circuit, in accordance with an embodiment of the present invention.

FIG. 1 is a functional block diagram of a voltage regulator circuit for a mixed charge pump circuit, in accordance with an embodiment of the present invention. The embodiment of FIG. 1 generally includes a first charge pump circuit 102, a second charge pump circuit 104, a V1 voltage coupler circuit 106, a V1 current coupler circuit 108, a V2 current coupler circuit 110, a V2 voltage coupler circuit 112, a first capacitive load 114, a second capacitive load 116, a variable resistance 118, and a comparator 120.

The charge pumps 102 and 104 may generally be any device, circuit, or combination thereof configured to provide charge to other electrical components or devices coupled thereto. In various embodiments, the charge pumps 102 and 104 may have one or more stages that, when selectively activated, provide charge to connected electrical components (e.g., a capacitive load) until the charge on the electrical component reaches a target voltage. In some embodiments, the first charge pump circuit 102 and the second charge pump circuit 104 are configured to charge certain connected components to different voltages. For example, the first charge pump circuit 102 may be configured to charge attached components to a first voltage V1 and the second charge pump circuit 104 may be configured to charge attached components to a second voltage V2. In various embodiments, the first charge pump circuit 102 is configured to charge gate voltages of one or more wordline pass gates to the first voltage V1. In various embodiments, the second charge pump circuit 104 is configured to provide charge to one or more wordlines, for example, during a program operation of a memory device. An example charge pump circuit is described in further detail below with respect to FIG. 3.

The V1 voltage coupler circuit 106 and the V1 current coupler circuit 108 are configured to voltage couple and current couple, respectively, the output of the first charge pump circuit 102 to a common node 122 to provide a regulated voltage Vreg. The V2 current coupler circuit 110 and V2 voltage coupler circuit 112 are configured to current couple and voltage couple, respectively, the output of the second charge pump circuit 104 to a common node 122 to provide the regulated voltage Vreg. By voltage coupling and current coupling the outputs of the first charge pump circuit 102 and the second charge pump circuit 104 to the common node 122, a single charge pump regulator may be used to regulate the outputs of both the first charge pump circuit 102 and the second charge pump circuit 104, as will be explained in greater detail below.

The first capacitive load 114 may generally be any electrical component, device, or combination thereof that receives charge from the first charge pump circuit 102 during a charging interval. The first charge pump circuit 102 may provide charge to the first capacitive load 114 until a voltage on the first capacitive load 114 is equal to a target voltage (e.g., V1). In various embodiments, the first capacitive load 114 may correspond to one or more pass gates that, when activated, allow charge to be provided to one or more wordlines of a memory array in a memory device.

The second capacitive load 116 may generally be any electrical component, device, or combination thereof that is configured to be charged to the reference voltage Vreg. The second capacitive load 116 may receive charge from the first charge pump circuit 102 and the second charge pump circuit 104, provided through the V1 voltage coupler circuit 106, the V1 current coupler circuit 108, the V2 current coupler circuit 110, and the V2 voltage coupler. In various embodiments, the second capacitive load 116 may correspond to one or more wordlines of a memory array in a memory device. In some embodiments, the first capacitive load 114 may be smaller than the second capacitive load 116, but the first capacitive load 114 may require a higher target voltage than the second capacitive load 116. That is, the first voltage V1 provided to the first capacitive load 114 may be substantially greater than the regulated voltage Vreg provided to the second capacitive load 116.

By providing a mixed charge pump configuration (e.g., the embodiment of FIG. 1 including two charge pumps), the first charge pump circuit 102 may be configured to charge the first capacitive load 114 to the first voltage V1, while the second charge pump circuit 104 may be configured to charge to the second voltage, V2, which may be substantially lower than the first voltage, V1. In many traditional configurations using a single charge pump, the single charge pump needs to charge to the higher voltage (e.g., V1) and then be voltage coupled down to the lower voltage (e.g., Vreg). A mixed charge pump configuration, for example, as shown in FIG. 1, provides improved power efficiency and rise time of the regulated voltage Vreg because the second charge pump circuit 104 can be regulated at the lower voltage (i.e., V2).

The V1 voltage coupler circuit 106 may be coupled to the variable resistance 118, which may be coupled to ground. The variable resistance 118 and the comparator 120 may be collectively referred to as the feedback circuit. The comparator 120 may be configured to receive a reference voltage Vref and a feedback voltage Vfb. The feedback voltage Vfb may be based on the variable resistance 118 and the regulated voltage Vreg. The variable resistance 118 may act as a resistor divider. By adjusting the resistance ratio, the gain of the comparator 120 may be adjusted. By adjusting the gain, the charge pump circuits 102 and 104 can be regulated at different voltage levels. In an alternative embodiment, the resistance 118 may be fixed and the reference voltage Vref may be adjusted. The output of the comparator 120 may be provided to the first charge pump circuit 102 and the second charge pump circuit 104. The first charge pump circuit 102 and the second charge pump circuit 104 may be selectively activated based on the output of the comparator 120. The output of the comparator 120 may be a voltage that is indicative of the voltage difference between the feedback voltage Vfb and the reference voltage Vref.

In operation, the first charge pump circuit 102 may be selectively activated, and provide charge to the first capacitive load 114, charging the first capacitive load 114 to the first voltage V1. The output of the first charge pump circuit 102 may also be voltage coupled and current coupled to a common node 122 coupled to the second capacitive load 116, to provide a portion of the charge to the second capacitive load 116 as the second capacitive load 116 is charged to the regulated voltage Vreg. The second charge pump circuit 104 may be voltage coupled and current coupled to the common node 122 coupled to the second capacitive load 116 to provide a portion of the charge to the second capacitive load 116 as the second capacitive load 116 is charged to the regulated voltage Vreg. In various embodiments, the first voltage V1 may be greater than the second voltage V2 and the regulated voltage Vreg, and the second voltage V2 may be substantially the same as the regulated voltage Vreg. Because two charge pumps are employed, one of the charge pumps (i.e. the first charge pump circuit 102) may be configured to provide charge for a first target voltage (i.e., V1), while the other charge pump (i.e., the second charge pump circuit 104) may be configured to provide charge for a second, lower target voltage (i.e., V2). This configuration may lead to improved power efficiency by allowing the second charge pump circuit 104 to remain at a lower voltage V2, instead of charging a single charge pump up to the highest target voltage (i.e., V1) and then reducing the voltage to the lower target voltage (i.e., V2). By current coupling and voltage coupling the outputs of the first charge pump circuit 102 and the second charge pump circuit 104, a single feedback circuit may be used to regulate the charge pumps 102 and 104 based on the regulated voltage Vreg.

Figure 2:
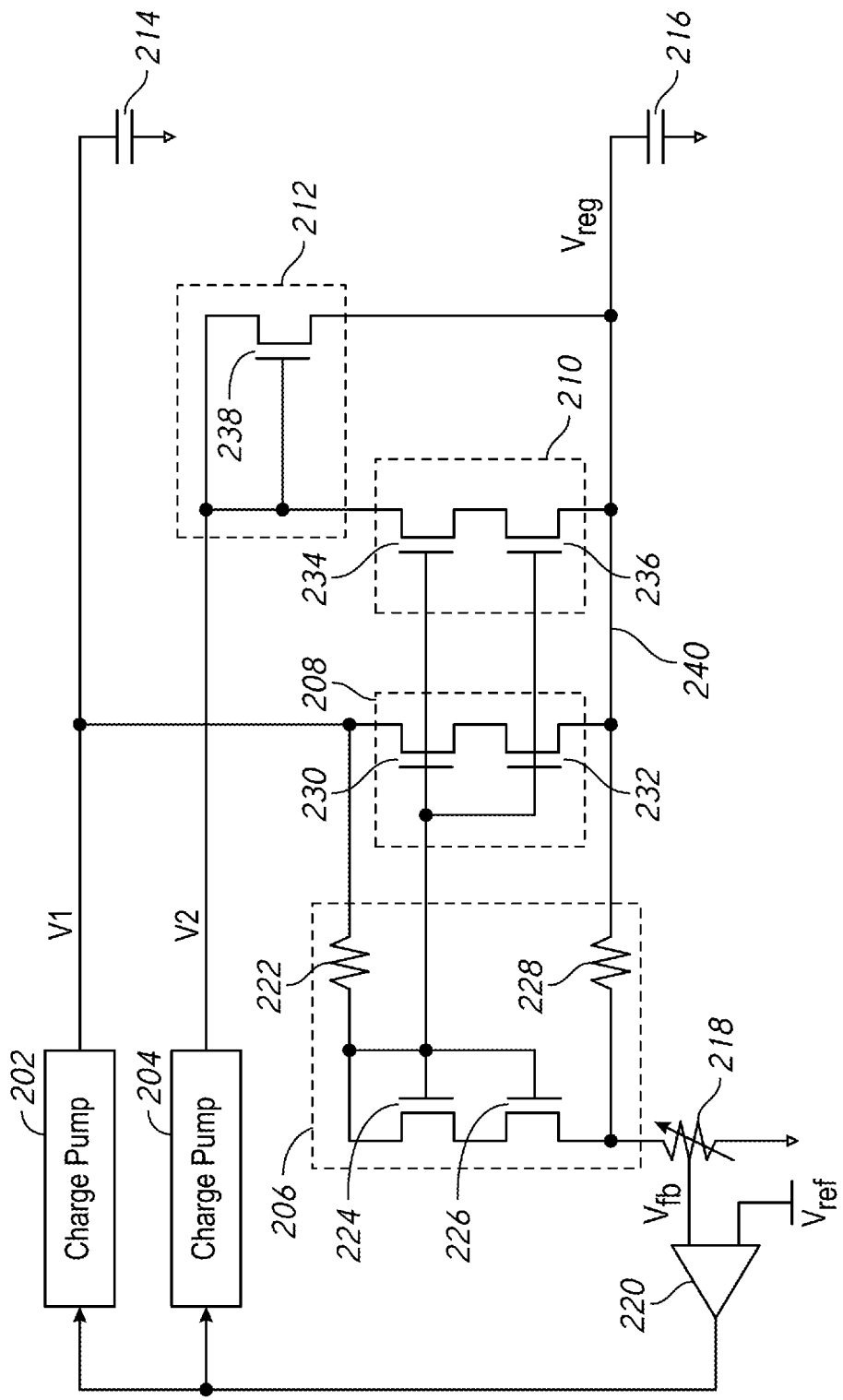
FIG. 2 is a schematic diagram of a mixed charge pump with a voltage regulator circuit, in accordance with an embodiment of the present invention.

FIG. 2 is a schematic diagram of a voltage regulator circuit for a mixed charge pump, in accordance with an embodiment of the present invention. The embodiment of FIG. 2 generally includes a first charge pump circuit 202, a second charge pump circuit 204, a V1 voltage coupler circuit 206, a V1 current coupler circuit 208, a V2 current coupler circuit 210, a V2 voltage coupler circuit 212, a first capacitive load 214, a second capacitive load 216, a variable resistance 218, and a comparator 220. The first charge pump circuit 202, the second charge pump circuit 204, the V1 voltage coupler circuit 206, the V1 current coupler circuit 208, the V2 current coupler circuit 210, the V2 voltage coupler circuit 212, the first capacitive load 214, the second capacitive load 216, the variable resistance 218, and the comparator 220 may be implemented as the first charge pump circuit 102, the second charge pump circuit 104, the V1 voltage coupler circuit 106, the V1 current coupler circuit 108, the V2 current coupler circuit 110, the V2 voltage coupler circuit 112, the first capacitive load 114, the second capacitive load 116, the variable resistance 118, and the comparator 120, respectively, as previously described with reference to FIG. 1. In the embodiment of FIG. 2, the voltage coupler circuits may be characterized by circuit connections including a transistor having a gate and a drain that are directly connected to a first voltage to be coupled and a source that is coupled to a second voltage to be coupled. The current coupler circuits may be characterized by circuit connections including transistors having a source coupled to a first current to be coupled and a drain coupled to a second current to be coupled.

The V1 voltage coupler circuit 206 may couple the voltage of the first charge pump circuit 202 with the regulated voltage Vreg. The V1 voltage coupler circuit 206 may include a first resistance 222, a first transistor 224, a second transistor 226, and a second resistance 228. The first transistor 224 and the second transistor 226 may be, for example, n-channel field effect transistors NFETs. The output of the first charge pump circuit 202 may be coupled to the first resistance 222, which may be coupled to the drain of the first transistor 224 and the gates of the first transistor 224 and the second transistor 226. The source of the first transistor 224 may be coupled to the drain of the second transistor 226. The source of the second transistor 226 may be coupled to the variable resistance 218 and to the second resistance 228. The second resistance 228 may be coupled to the outputs of the V1 current coupler circuit 208, the V2 current coupler circuit 210, and the V2 voltage coupler circuit 212 at the common node 240. The common node 240 may be coupled to the second capacitive load 216.

The V1 current coupler circuit 208 couples the output current of the first charge pump circuit 202 with the current provided to the second capacitive load 216. The V1 current coupler circuit 208 may include a third transistor 230 and a fourth transistor 232. The third transistor 230 and the fourth transistor 232 may each be, for example, NFET transistors. The gates of the third transistor 230 and the second transistor 232 may each be coupled to the gates of the first transistor 224 and the second transistor 226 in the V1 voltage coupler circuit 206. The output of the first charge pump circuit 202 may be coupled to the drain of the third transistor 230. The source of the third transistor 230 may be coupled to the drain of the fourth transistor 232. The source of the fourth transistor 232 may be coupled to the second resistor 228 of the V1 voltage coupler circuit 206 between the second resistor 228 and the second capacitive load 216.

The V2 current coupler circuit 210 couples the output current of the second charge pump circuit 204 to the common node 240. The V2 current coupler circuit 210 includes a fifth transistor 234 and a sixth transistor 236. The fifth transistor 234 and the sixth transistor 236 may each be, for example, NFET transistors. The gates of the fifth transistor 234 and sixth transistor 236 may each be coupled to the gates of the first transistor 224 and the second transistor 226. The output of the second charge pump circuit 204 may be coupled to the drain of the fifth transistor 234. The source of the fifth transistor 234 may be coupled to the drain of the sixth transistor 236. The source of the sixth transistor 236 may be coupled to the V1 current coupler circuit 208 and the V2 current coupler circuit 210 at the common node 240 between the second resistor 228 and the second capacitive load 216. In various embodiments, the first transistor 224, the third transistor 230, and the fifth transistor 234 may have substantially the same transistor characteristics. Similarly, the second transistor 226, the fourth transistor 232, and the sixth transistor 236 may have substantially the same transistor characteristics.

The V2 voltage coupler circuit 212 may act as a voltage clamp to couple the output voltage of the second charge pump circuit 204 (e.g., V2) to the regulated voltage Vreg. The V2 voltage coupler circuit 212 may include a seventh transistor 238. The output of the second charge pump circuit 204 may be coupled to the drain and the gate of the seventh transistor 238. The source of the seventh transistor may be coupled to the V1 current coupler circuit 208 and the V2 current coupler circuit 210 at the common node 240.

As discussed above, the source of the second transistor 226 may be coupled to the variable resistance 218, which may be coupled to ground. The comparator 220 may receive a reference voltage Vref as a first input and a feedback voltage Vfb, based on the variable resistance 218, as a second input. The output of the comparator 220 may be provided to the first charge pump circuit 202 and the second charge pump circuit 204. The first charge pump circuit 202 and the second charge pump circuit 204 may be selectively activated based on the output of the comparator 220. The variable resistance 218 and the comparator 220 may be collectively referred to as the feedback circuit.

In operation, the first charge pump circuit 202 charges first capacitive load 214, which may be pass gates to one or more wordlines of a memory array (e.g., a wordline passgate of a 3D cross-point array), to the first voltage, V1. The second charge pump circuit 204 charges the second capacitive load 216 through the V2 current coupler circuit 210 and the V2 voltage coupler circuit 212. The first charge pump circuit 202 is also coupled to the second capacitive load 216 through the V1 voltage coupler circuit 206 and the V2 current coupler circuit 208. The first charge pump circuit 202 and the second charge pump circuit 204 may be configured to charge to the first voltage V1 and the second voltage V2, respectively, such that the first charge pump circuit 202 primarily provides charge to the first capacitive load 214 and the second charge pump circuit 204 primarily provides charge to the second capacitive load 216. Accordingly, the second voltage V2 may be regulated to provide the regulated voltage, Vreg, and the second voltage V2 may be maintained by the second charge pump circuit 204 at a level that is less than the first voltage, V1. Therefore, the second charge pump circuit 204 may use fewer charge pump stages than traditional charge pumps, which improves power consumption, area, and rise time of the charge pump circuits.

Figure 3:
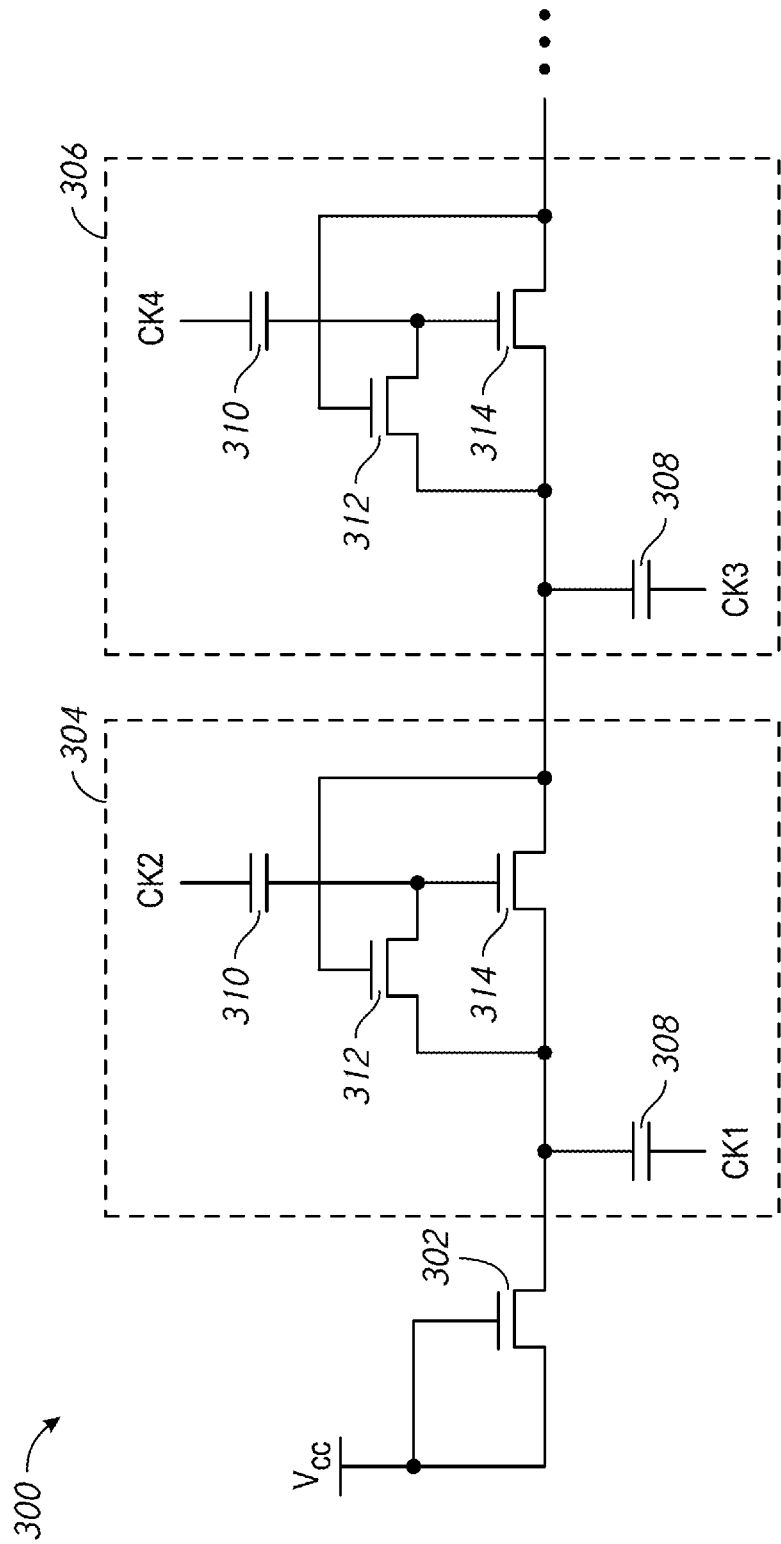
FIG. 3 is a schematic diagram of a charge pump circuit, in accordance with an embodiment of the present invention.

FIG. 3 is a schematic diagram of a charge pump circuit, generally designated 300, in accordance with an embodiment of the present invention. Those skilled in the art will appreciate that the charge pump circuit 300 is provided only as an example, and that alternative charge pump circuits may be implemented without departing from the scope of this disclosure. The charge pump circuit 300 generally includes a first transistor 302, a first stage 304, and a second stage 306. While only two stages are shown in FIG. 3, those skilled in the art will appreciate that any number of stages may be used. In one embodiment, the charge pump circuit 300 may include 20 stages. In other embodiments, more than 20 stages may be used. The number of stages may be selected based on the target voltage to which the charge pump circuit 300 provides charge to achieve.

The first transistor 302 may be diode coupled to a voltage source $V_{cc}$, and the source of the first transistor 302 may be coupled to the first stage 304. The first stage 304 includes a first capacitor 308 coupled to a first clock CK1, a second capacitor 310 coupled to a second clock CK2, a second transistor 312, and a third transistor 314. The first capacitor 308 may be coupled to the drains of the first transistor 312 and the second transistor 314. The second capacitor 310 may be coupled to the source of the first transistor 312 and the gate of the second transistor 314. The gate of the first transistor 312 may be coupled to the source of the second transistor 314. The source of the second transistor 314 may also provide the output signal of the first stage 304.

The first clock CK1 and the second clock CK2 may be based, at least in part, on the output of a comparator (e.g., the comparator 120 and/or the comparator 220). Based on the output of the comparator, the first clock CK1 and/or the second clock CK2 may be selectively activated to pump charge from the first stage 304. The second stage 306 operates in much the same way as the first stage 304. However, in the second stage 306, the first clock CK1 is replaced by a third clock CK3 and the second clock CK2 is replaced by a fourth clock CK4. As with the first stage 304, the third clock CK3 and the fourth clock CK4 may be based, at least in part, on the output signal of a comparator, such as the comparator 120 or 220. Because the charge pump circuit 300 uses four independent clocks, the charge pump circuit may be referred to as a four phase charge pump. The first clock CK1, second clock CK2, third clock CK3, and fourth clock CK4 may be provided by conventional clock circuits. As such, a detailed discussion of the clock circuits has been omitted herein in the interest of brevity.

Figure 4:
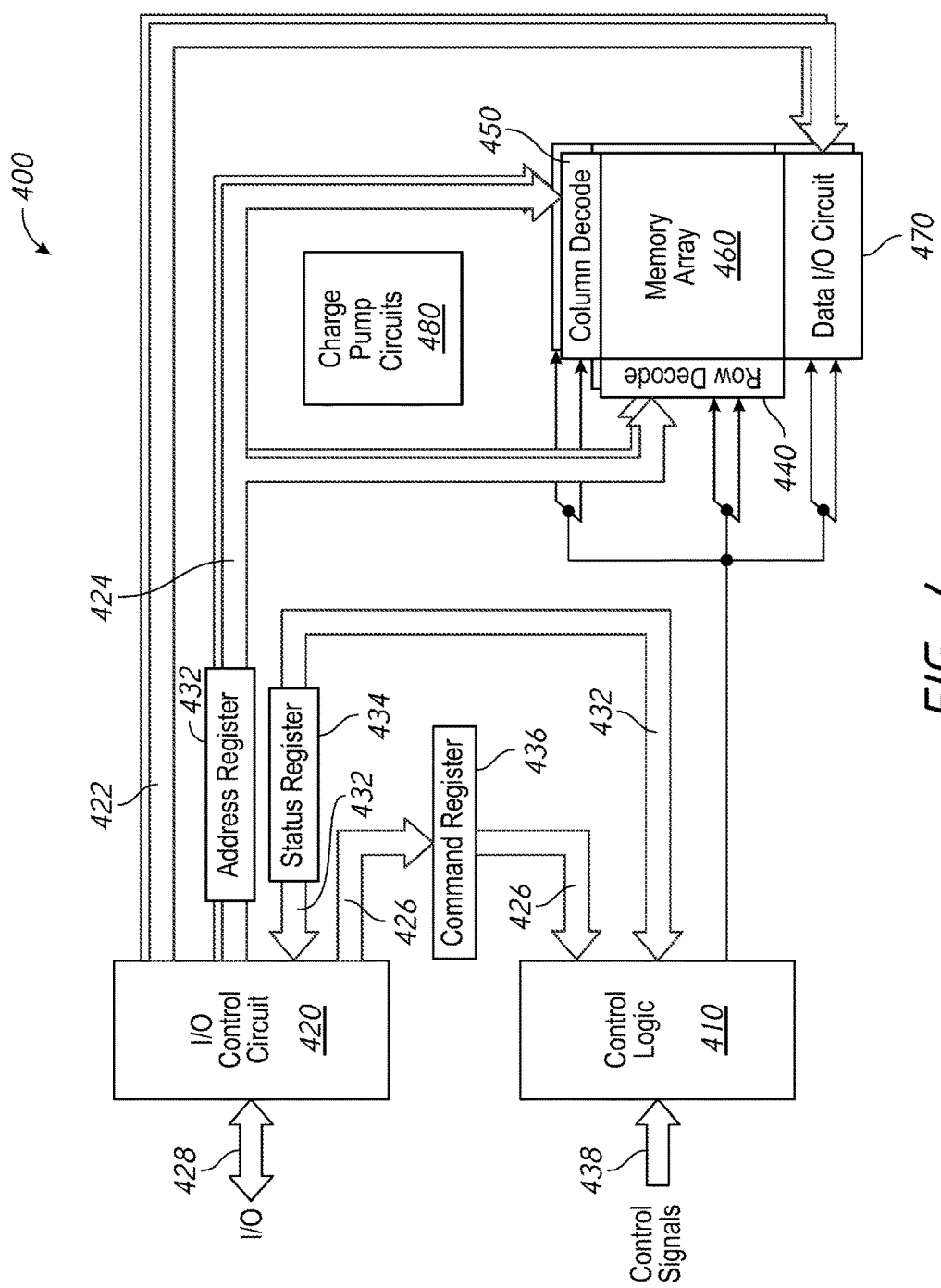
FIG. 4 is a block diagram of a memory, in accordance with an embodiment of the present invention.

FIG. 4 illustrates an apparatus that includes a memory device 400 according to an embodiment of the present invention. The memory device 400 includes a memory array 460 with a plurality of memory cells that are configured to store data. The memory cells may be accessed in the array through the use of various signal lines, word lines (WLs) and/or bit lines (BLs). The memory cells may be non-volatile memory cells, such as NAND or NOR flash cells, phase change memory cells, or may generally be any type of memory cells. The memory cells of the memory array 460 can be arranged in a memory array architecture. For example, in one embodiment, the memory cells are arranged in a 3D cross-point architecture. In other embodiments, other memory array architectures may be used, for example, a single-level cross-point architecture, among others. The memory cells may be single level cells configured to store data for one bit of data. The memory cells may also be multi-level cells configured to store data for more than one bit of data.

A data strobe signal DQS may be transmitted through a data strobe bus (not shown). The DQS signal may be used to provide timing information for the transfer of data to the memory device 400 or from the memory device 400. The I/O bus 428 is connected to an I/O control circuit 420 that routes data signals, address information signals, and other signals between the I/O bus 428 and an internal data bus 422, an internal address bus 424, and/or an internal command bus 426. An address register 425 may be provided address information by the I/O control circuit 420 to be temporarily stored. The I/O control circuit 420 is coupled to a status register 434 through a status register bus 432. Status bits stored by the status register 434 may be provided by the I/O control circuit 420 responsive to a read status command provided to the memory device 400. The status bits may have respective values to indicate a status condition of various aspects of the memory and its operation.

The memory device 400 also includes a control logic 410 that receives a number of control signals 438 either externally or through the command bus 426 to control the operation of the memory device 400. The control signals 438 may be implemented with any appropriate interface protocol. For example, the control signals 438 may be pin based, as is common in dynamic random access memory and flash memory (e.g., NAND flash), or op-code based. Example control signals 438 include clock signals, read/write signals, clock enable signals, etc. A command register 436 is coupled to the internal command bus 426 to store information received by the I/O control circuit 420 and provide the information to the control logic 410. The control logic 410 may further access a status register 434 through the status register bus 432, for example, to update the status bits as status conditions change. The control logic 410 may be configured to provide internal control signals to various circuits of the memory device 400. For example, responsive to receiving a memory access command (e.g., read, write), the control logic 410 may provide internal control signals to control various memory access circuits to perform a memory access operation. The various memory access circuits are used during the memory access operation, and may generally include circuits such as row and column decoders, charge pump circuits, signal line drivers, data and cache registers, I/O circuits, as well as others.

The address register 425 provides block-row address signals to a row decoder 440 and column address signals to a column decoder 450. The row decoder 440 and column decoder 450 may be used to select blocks of memory cells for memory operations, for example, read and write operations. The row decoder 440 and/or the column decoder 450 may include one or more signal line drivers configured to provide a biasing signal to one or more of the signal lines in the memory array 460. The signal line drivers may drive the signal lines with a pumped voltage that is provided by charge pump circuits 480. The charge pump circuits 480 may be implemented as described above with respect to FIGS. 1-3. The charge pump circuits 480 may provide different voltages used during operation of the memory 400, for example, during memory access operations. The voltages provided by the charge pump circuits 480 may include voltages that are greater than a power supply voltage provided to the memory 400, voltages that are less than a reference voltage (e.g., ground) provided to the memory 400, as well as other voltages as well. In some embodiments, the charge circuits 480 may be configured to open wordline pass gates and provide charge to wordlines of the memory array 460.

A data I/O circuit 470 includes one or more circuits configured to facilitate data transfer between the I/O control circuit 420 and the memory array 460 based on signals received from the control logic 410. In various embodiments, the data I/O circuit 470 may include one or more registers, buffers, and other circuits for managing data transfer between the memory array 460 and the I/O control circuit 420. For example, during a write operation, the I/O control circuit 420 receives the data to be written through the I/O bus 428 and provides the data to the data I/O circuit 470 via the internal data bus 422. The data I/O circuit 470 writes the data to the memory array 460 based on control signals provided by the control logic 410 at a location specified by the row decoder 440 and the column decoder 450. During a read operation, the data I/O circuit reads data from the memory array 460 based on control signals provided by the control logic 410 at an address specified by the row decoder 440 and the column decoder 450. The data I/O circuit provides the read data to the I/O control circuit via the internal data bus 422. The I/O control circuit 420 then provides the read data on the I/O bus 428.

Those of ordinary skill would further appreciate that the various illustrative logical blocks, configurations, modules, circuits, and algorithm steps described in connection with the embodiments disclosed herein may be implemented as electronic hardware, computer software executed by a processor, or combinations of both. Various illustrative components, blocks, configurations, modules, circuits, and steps have been described above generally in terms of their functionality. Skilled artisans may implement the described functionality in varying ways for each particular application, but such implementation decisions should not be interpreted as causing a departure from the scope of the present disclosure.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as previously described.

What is claimed is:

1. An apparatus comprising:
    a first charge pump circuit configured to provide a first output;
    a second charge pump circuit configured to provide a second output;
    a plurality of coupling circuits configured to voltage couple and current couple the first output and the second output to a common node to provide a regulated voltage; and
    a feedback circuit configured to regulate the first output and the second output based on the regulated voltage.
2. The apparatus of claim 1, wherein the plurality of coupling circuits comprises:

a first voltage coupler circuit configured to voltage couple the first output to the common node;
a second voltage coupler circuit configured to voltage couple the second output to the common node;
a first current coupler circuit configured to current couple the first output to the common node; and
a second current coupler circuit configured to current couple the second output to the common node.

3. The apparatus of claim 2, wherein the first voltage coupler circuit comprises:
a first resistance coupled to the first output;
a first NFET and a second NFET coupled in series to the first resistance; and
a second resistance coupled to the second NFET and the common node.

4. The apparatus of claim 3, wherein a gate of the first NFET and a gate of the second NFET are coupled to the first resistance.

5. The apparatus of claim 2, wherein the second voltage coupler circuit comprises:
a first NFET diode coupled to the second output, wherein the first NFET is further coupled to the common node.

6. The apparatus of claim 2, wherein the first current coupler circuit comprises a first NFET and a second NFET coupled in series between the first output and the common node.

7. The apparatus of claim 2, wherein the second current coupler circuit comprises a first NFET and a second NFET coupled in series between the second output and the common node.

8. An apparatus comprising:
a first charge pump circuit configured to provide a first output;
a second charge pump circuit configured to provide a second output;
a plurality of coupling circuits configured to voltage couple and current couple the first output and the second output to a common node to provide a regulated voltage, the plurality of coupling circuits comprises:
a first current coupler circuit comprising a first NFET and a second NFET coupled in series between the first output and the common node, and
a second current coupler circuit comprising a third NFET and a fourth NFET coupled in series between the second output and the common node; and
a feedback circuit configured to regulate the first output and the second output based on the regulated voltage.

9. The apparatus of claim 8, wherein the plurality of coupling circuits further comprises:
a first voltage coupler circuit configured to voltage couple the first output to the common node; and
a second voltage coupler circuit configured to voltage couple the second output to the common node.

10. The apparatus of claim 8, wherein the first current coupler circuit is configured to current couple the first output to the common node.

11. The apparatus of claim 8, wherein the second current coupler circuit is configured to current couple the second output to the common node.

12. The apparatus of claim 9, wherein the first voltage coupler circuit comprises:
a first resistance coupled to the first output;
a first NFET and a second NFET coupled in series to the first resistance; and
a second resistance coupled to the second NFET and the common node.

13. The apparatus of claim 12, wherein a gate of the first NFET and a gate of the second NFET are coupled to the first resistance.

14. The apparatus of claim 9, wherein the second voltage coupler circuit comprises a first NFET diode coupled to the second output, the first NFET diode is further coupled to the common node.

\* \* \* \* \*